US012568585B2

(12) United States Patent
Abe et al.

(10) Patent No.: US 12,568,585 B2
(45) Date of Patent: Mar. 3, 2026

(54) ANTENNA MODULE

(71) Applicant: TDK Corporation, Tokyo (JP)

(72) Inventors: Toshiyuki Abe, Tokyo (JP); Kazutoshi Tsuyutani, Tokyo (JP); Naoyuki Ishikawa, Tokyo (JP)

(73) Assignee: TDK Corporation, Tokyo (JP)

( * ) Notice: Subject to any disclaimer, the term of this patent is extended or adjusted under 35 U.S.C. 154(b) by 241 days.

(21) Appl. No.: 18/609,434

(22) Filed: Mar. 19, 2024

(65) Prior Publication Data

US 2024/0334609 A1 Oct. 3, 2024

Related U.S. Application Data

(60) Provisional application No. 63/493,231, filed on Mar. 30, 2023.

(51) Int. Cl.
| | |
|---|---|
| *H05K 1/182* | (2026.01) |
| *H05K 1/02* | (2006.01) |
| *H05K 1/11* | (2006.01) |

(52) U.S. Cl.
CPC ........... *H05K 1/182* (2013.01); *H05K 1/0237* (2013.01); *H05K 1/111* (2013.01); *H05K 1/115* (2013.01); *H05K 2201/10439* (2013.01)

(58) Field of Classification Search
None
See application file for complete search history.

(56) References Cited

U.S. PATENT DOCUMENTS

| | | | | |
|---|---|---|---|---|
| 8,779,299 B2 * | 7/2014 | Tsuyutani | .............. | H05K 1/185 |
| | | | | 361/761 |
| 2010/0328913 A1 * | 12/2010 | Kugler | .................... | H01L 24/18 |
| | | | | 29/841 |
| 2014/0062607 A1 * | 3/2014 | Nair | ........................ | H01L 25/16 |
| | | | | 361/679.02 |
| 2014/0133117 A1 * | 5/2014 | Saji | ........................ | H01L 24/19 |
| | | | | 361/761 |
| 2019/0334220 A1 * | 10/2019 | Ali | .................... | H01L 23/49822 |
| 2021/0375754 A1 * | 12/2021 | Landesberger | ......... | H01L 24/73 |
| 2022/0077583 A1 * | 3/2022 | Jian | ........................... | H01Q 9/04 |

FOREIGN PATENT DOCUMENTS

| | | |
|---|---|---|
| JP | 2022-533763 A | 7/2022 |

* cited by examiner

*Primary Examiner* — Krystal Robinson
(74) *Attorney, Agent, or Firm* — Rimon P.C.

(57) ABSTRACT

Disclosed herein is an apparatus that includes a multilayer substrate including a plurality of conductive layers and a plurality of insulating layers alternately stacked, and an electronic component having a first signal pad. The plurality of conductive layers include a first internal conductive layer having a first signal pattern, and a second internal conductive layer having a second signal pattern. The plurality of insulating layers include a first insulating layer positioned between the first and second internal conductive layers. The electronic component is embedded in the first insulating layer such that the first signal pad is connected to the first signal pattern. The first and second signal patterns are connected to each other by a first via conductor penetrating through the first insulating layer. The distance between the electronic component and the first via conductor is greater than a diameter of the first via conductor.

15 Claims, 14 Drawing Sheets

100

ANT3

ANT4

ANT1

ANT2

| Cross talk pass | | R1 to R2 | | R1 to TX | | R2 to TX | |
|---|---|---|---|---|---|---|---|
| | L/D | Cross talk (dB) | Freq (GHz) | Cross talk (dB) | Freq (GHz) | Cross talk (dB) | Freq (GHz) |
| Sample A | 0.26 | D200/L52 | -18.6 | 55.8 | -23.3 | 64.9 | -27.6 | 52 |
| Sample B | 0.63 | D135/L85 | -19.7 | 55.2 | -23.9 | 64.1 | -26.7 | 51.5 |
| Sample C | 1.26 | D200/L252 | -25.3 | 55.8 | -28.1 | 64.9 | -33.4 | 52 |
| Sample D | 1.37 | D135/L185 | -22.4 | 55.2 | -30.4 | 64.1 | -29.5 | 51.5 |
| Sample E | 2.11 | D135/L285 | -27.3 | 55.2 | -32.0 | 64.1 | -33.8 | 51.5 |

ANTENNA MODULE

CROSS-REFERENCE TO RELATED APPLICATION

This application claims the benefit of Provisional Patent Application No. 63/493,231, filed on Mar. 30, 2023, the entire disclosure of which is incorporated by reference herein.

BACKGROUND OF THE ART

Field of the Art

The present disclosure relates to an antenna module.

Description of Related Art

JP 2022-533763 discloses an antenna module in which an electronic component such as an RFIC and an antenna pattern are packaged.

Antenna characteristics of such type of antenna module may be deteriorated due to coupling between a signal line connecting an electronic component with an antenna pattern and the electronic component.

SUMMARY

The present disclosure describes a technology which enables to reduce coupling between a signal line and a electronic component in an antenna module that includes the electronic component and an antenna pattern.

An antenna module according to one aspect of the present disclosure: includes a multilayer substrate including a plurality of conductive layers and a plurality of insulating layers alternately stacked, and an electronic component embedded in the multilayer substrate and having a plurality of pad electrodes including a first signal pad. The plurality of conductive layers include an antenna layer having a plurality of antenna patterns, a first internal conductive layer having a first signal pattern, and a second internal conductive layer having a second signal pattern. The plurality of insulating layers include a first insulating layer positioned between the first and second internal conductive layers, and a second insulating layer positioned between the second internal conductive layer and the antenna layer. The electronic component is embedded in the first insulating layer such that the first signal pad is connected to the first signal pattern. The first and second signal patterns are connected to each other by a first via conductor penetrating through the first insulating layer. The second signal pattern and one of the antenna patterns are connected to each other by a second via conductor penetrating through the second insulating layer. The distance between the electronic component and the first via conductor is greater than a diameter of the first via conductor.

BRIEF DESCRIPTION OF THE DRAWINGS

The above features and advantages of the present disclosure will be more apparent from the following description of certain embodiments taken in conjunction with the accompanying drawings, in which.

DETAILED DESCRIPTION OF THE EMBODIMENTS

Some embodiments of the present disclosure will be explained below in detail with reference to the accompanying drawings.

Figure 1:
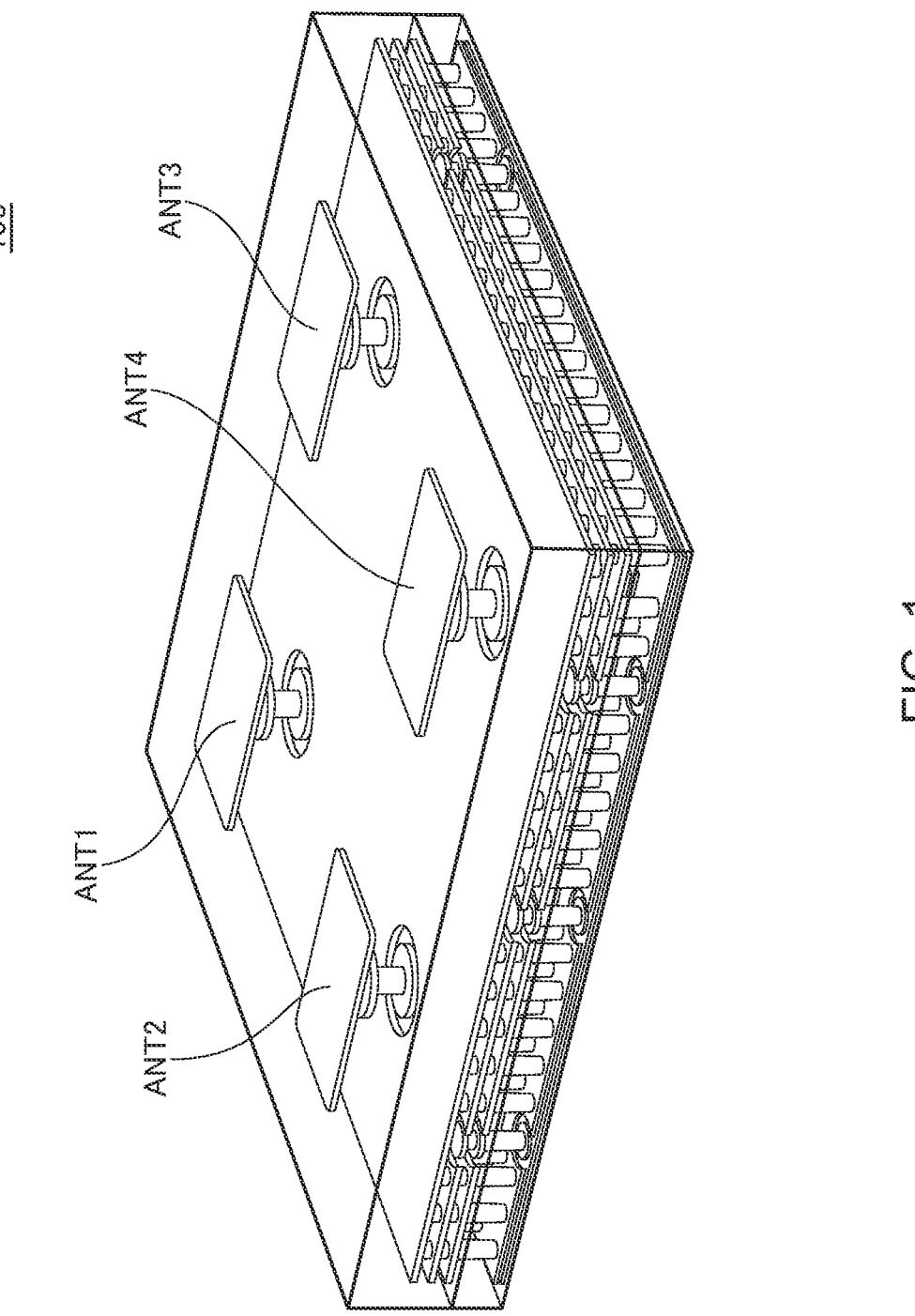
FIG. 1 is a schematic perspective view illustrating the outer appearance of an antenna module 100 according to an embodiment of the present disclosure.

FIG. 1 is a schematic perspective view illustrating the outer appearance of an antenna module 100 according to an embodiment of the present disclosure. The antenna module 100 is formed into a plate shape and has four antenna patterns ANT1 to ANT4 on the front surface thereof. The antenna module 100 further has a plurality of terminal electrodes on the back surface thereof.

Figure 2:
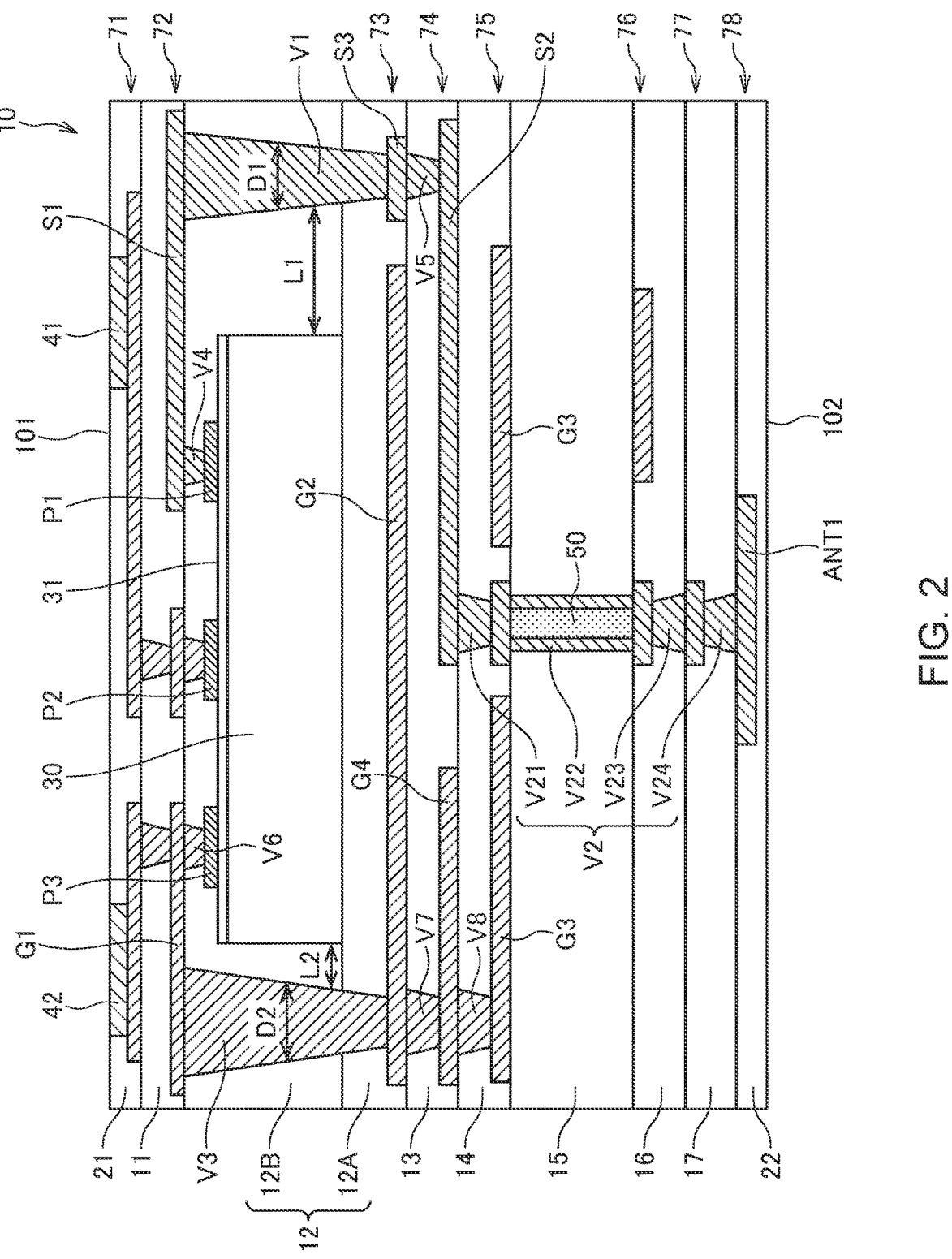
FIG. 2 is a schematic cross-sectional partial view of the antenna module 100.

FIG. 2 is a schematic cross-sectional partial view of the antenna module 100. As illustrated in FIG. 2, the antenna module 100 has a multilayer substrate 10 on which a plurality of conductor layers 71 to 78 and a plurality of insulating layers 11 to 17 are alternately stacked and an electronic component 30 embedded in the multilayer substrate 10. The insulating layers 11 and 13 to 17 are made of a core material obtained by impregnating a core material with resin, whereas the insulating resin 12 does not contain a core material preventing embedment of the electronic component 30 therein.

The conductor layer 71 positioned in one outermost layer is covered with a solder resist 21. The conductor layer 78 positioned in the other outermost layer is covered with a solder resist 22. The solder resist 21 constitutes a back surface 101 of the antenna module 100. The solder resist 21 has an opening through which a plurality of terminal electrodes including a signal terminal 41 and a ground terminal 42 are exposed. The signal terminal 41 and ground terminal 42 are connected to the conductor layer 71. The conductor layer 71 constitutes a terminal layer. The surface itself of the conductor layer 71 exposed from the solder resist 21 may be used as a terminal electrode. The plurality of terminal electrodes may be regarded as a part of the conductor layer 71. The solder resist 22 constitutes a front surface 102 of the antenna module 100. The conductor layers 72 to 77 each constitute an internal conductor layer.

The electronic component 30 is embedded in the insulating layer 12. The insulating layer 12 includes two insulating layers 12A and 12B, and the electronic component 30 is embedded between the insulating layers 12A and 12B. The electronic component 30 may be an RFIC chip. In the embedded state, a main surface 31 having thereon a plurality of pad electrodes including signal pads P1, P2 and a ground pad P3 faces the back surface 101 side. The signal pad P1 is connected to a signal pattern S1 positioned in the conductor layer 72 through a via conductor V4. The signal pad P2 is connected to the signal terminal 41. The ground pad P3 is connected to the ground terminal 42 through a via conductor V6 and a ground pattern G1 positioned in the conductor layer 72.

The signal pattern S1 is connected to a signal pattern S2 positioned in the conductor layer 74 through a via conductor V1 penetrating the insulating layer 12, a signal pattern S3 provided in the conductor layer 73, and a via conductor V5 penetrating the insulating layer 13. The signal pattern S2 is connected to the antenna pattern ANT1 positioned in the conductor layer 78 through a via conductor V2 penetrating the insulating layers 14 to 17. The conductor layer 78 constituting an antenna layer further includes other antenna patterns ANT2 to ANT4. The via conductor V2 is constituted by a plurality of sections, i.e., via conductors V21 to V24 respectively penetrating the insulating layers 14 to 17. The via conductors V21 to V24 overlaps one another in the stacking direction. The via conductor V22 is a tubular conductor pattern formed along the inner wall of a through hole penetrating the insulating layer 15. The area surrounded by the via conductor V22 is filled with an insulating resin 50.

The ground pattern G1 is connected to a ground pattern G2 provided in the conductor layer 73 through a via conductor V3 penetrating the insulating layer 12. The electronic component 30 mostly overlaps the ground pattern G2 in the stacking direction. The ground pattern G2 is connected to a ground pattern G4 positioned in the conductor layer 74 through a via conductor V7 penetrating the insulating layer 13. The ground pattern G4 is connected to a ground pattern G3 positioned in the conductor layer 75 through a via conductor V8 penetrating the insulating layer 14. The signal pattern S2 mostly sandwiched between the ground patterns G2 and G3.

The via conductor V1 has a diameter of D1. When the diameter of the via conductor V1 changes in the depth direction, D1 indicates the maximum diameter of the via conductor V1. The via conductor V3 has a diameter of D2. When the diameter of the via conductor V3 changes in the depth direction, D2 indicates the maximum diameter of the via conductor V3. The diameter D2 of the via conductor V3 may be larger than the diameter D1 of the via conductor V1. This makes a ground potential more stable.

The distance between the electronic component 30 and the via conductor V1 in the planar direction is L1. When the planer distance between the electronic component 30 and the via conductor V1 changes in the depth direction, L1 indicates the minimum planar distance between the electronic component 30 and the via conductor V1. The distance between the electronic component 30 and the via conductor V3 in the planar direction is L2. When the planer distance between the electronic component 30 and the via conductor V3 changes in the depth direction, L2 indicates the minimum planar distance between the electronic component 30 and the via conductor V3. The distance L1 may be larger than the distance L2. This reduces coupling between the via conductor V1 and the electronic component 30.

Figure 3A:
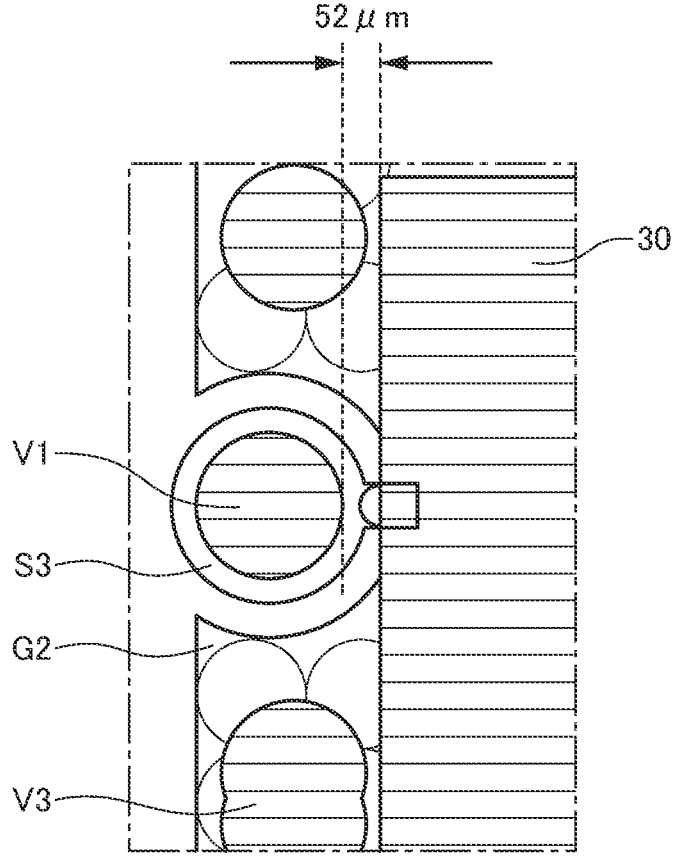
FIG. 3A is a schematic plan view for explaining the structure of sample A.
Figure 3B:
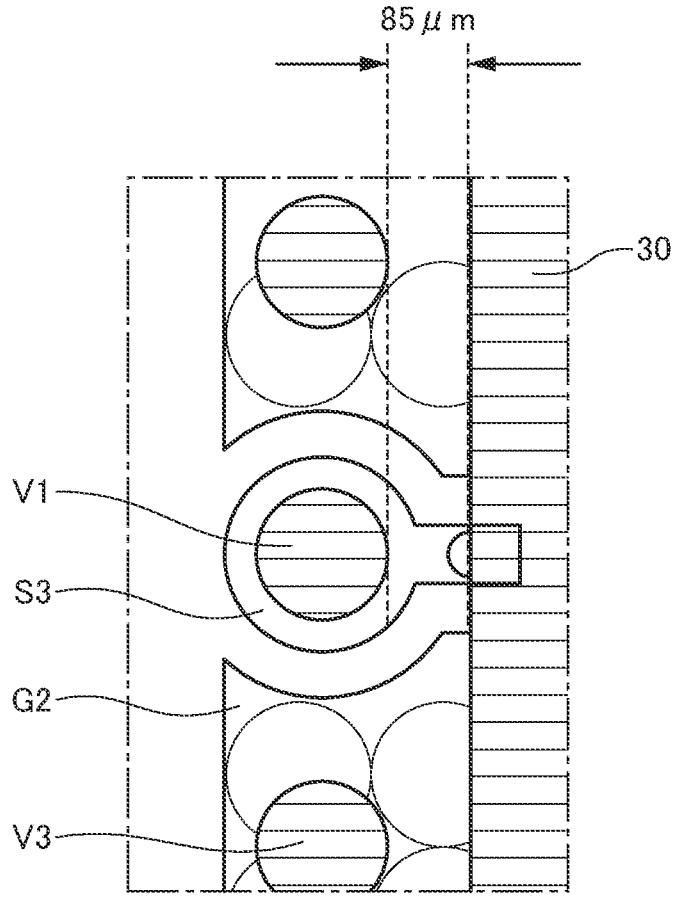
FIG. 3B is a schematic plan view for explaining the structure of sample B.
Figure 3C:
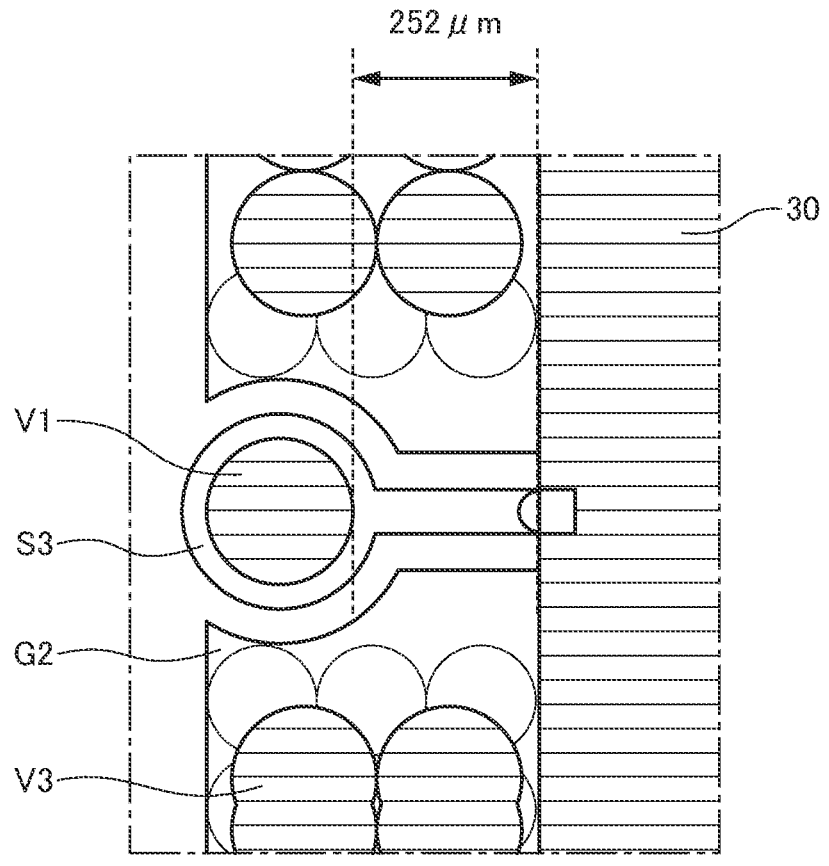
FIG. 3C is a schematic plan view for explaining the structure of sample C.
Figure 3D:
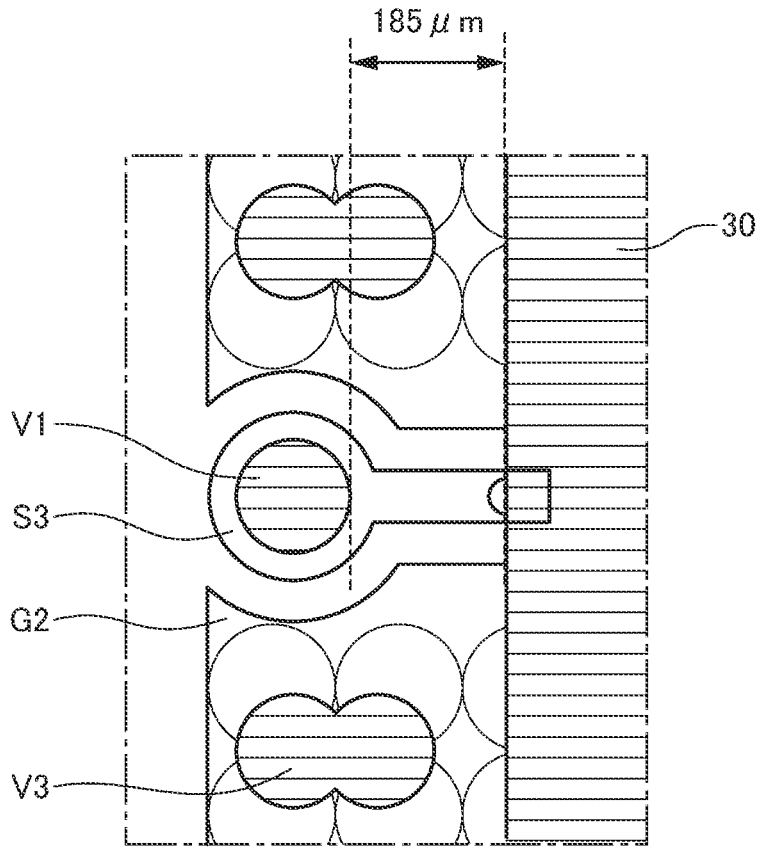
FIG. 3D is a schematic plan view for explaining the structure of sample D.
Figure 3E:
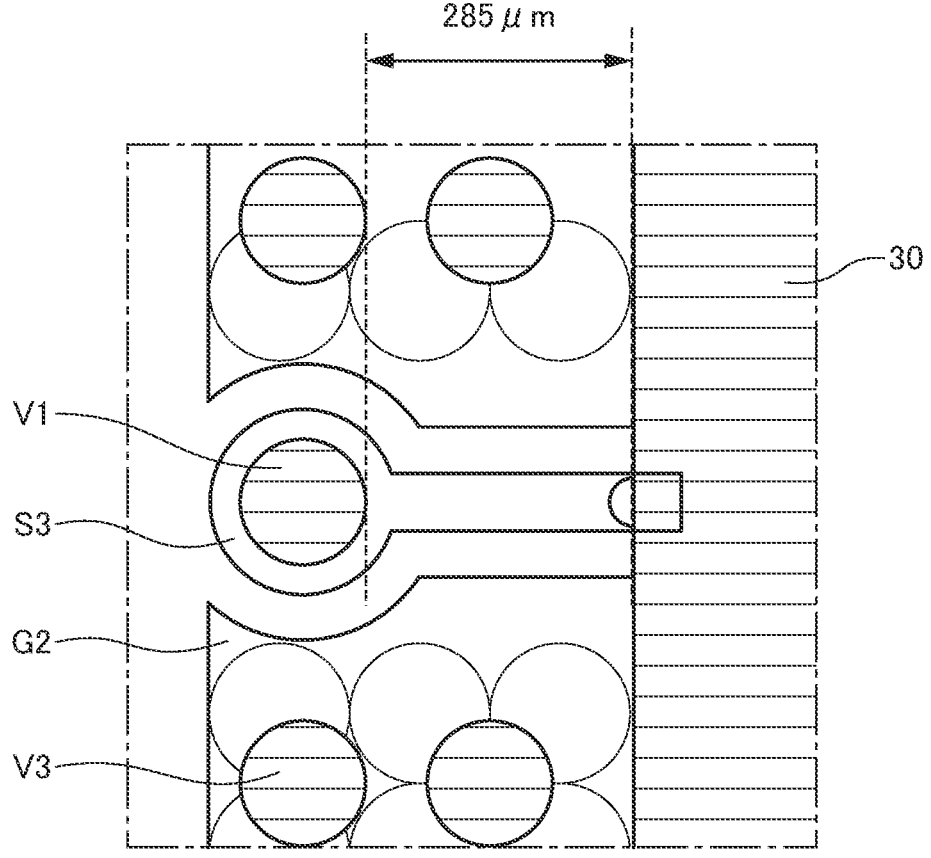
FIG. 3E is a schematic plan view for explaining the structure of sample E.
Figure 3F:
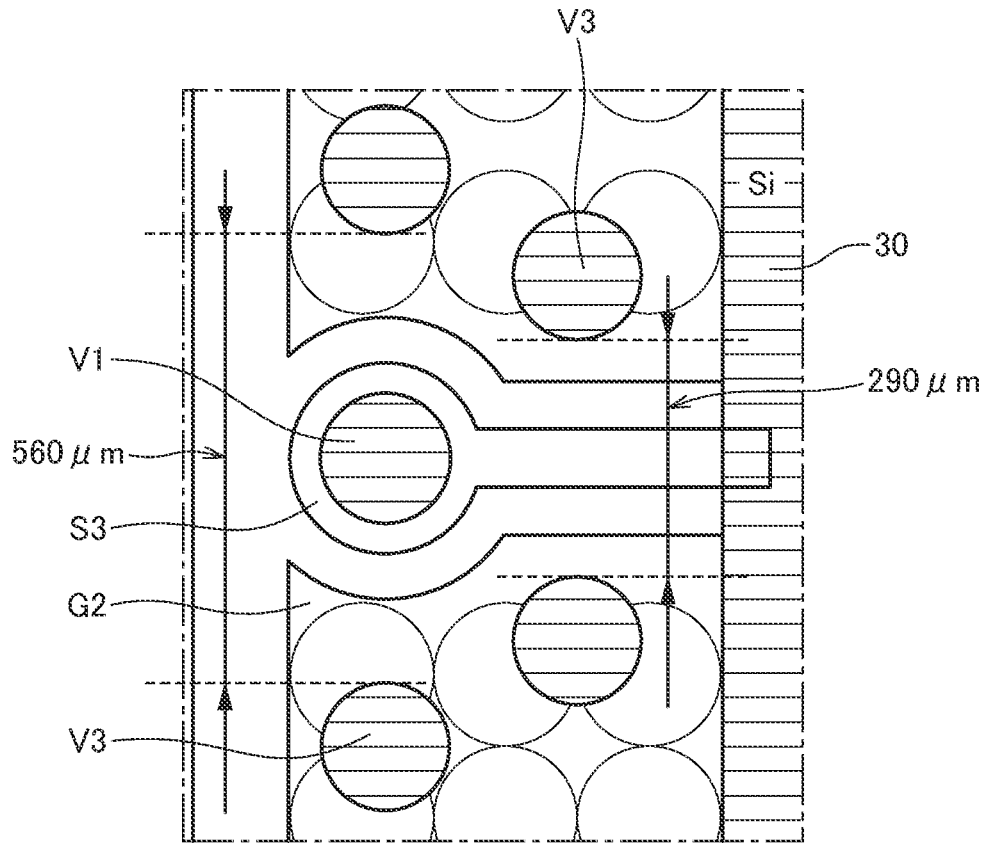
FIG. 3F is a schematic plan view for explaining the structure of sample F.
Figure 3G:
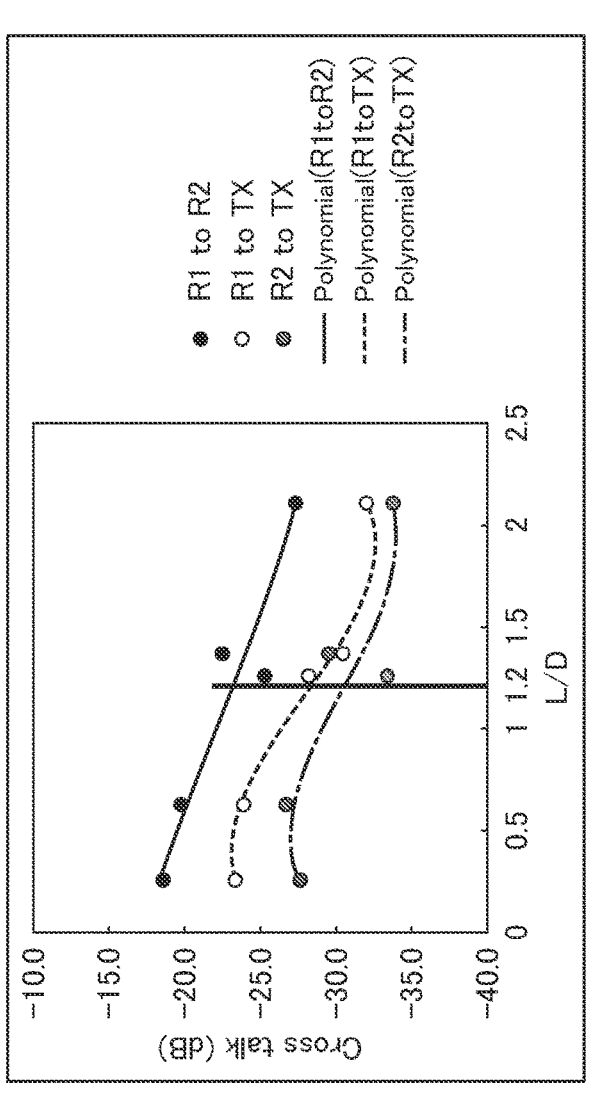
FIG. 3G is a table and graph showing crosstalk for samples A to E.

FIG. 3A illustrates a sample A in which the distance L1 and diameter D1 are 52 μm and 200 μm, respectively, FIG. 3B illustrates a sample B in which the distance L1 and diameter D1 are 85 μm and 135 μm, respectively, FIG. 3C illustrates a sample C in which the distance L1 and diameter D1 are 252 μm and 200 μm, respectively, FIG. 3D illustrates a sample D in which the distance L1 and diameter D1 are 185 μm and 135 μm, respectively, and FIG. 3E illustrates a sample E in which the distance L1 and diameter D1 are 285

μm and 135 μm, respectively. When the distance L1 is larger than the diameter D1 as in the samples C to E (FIGS. 3C to 3E), crosstalk between the antenna patterns ANT1 to ANT4 reduces as compared with when the distance L1 is smaller than the diameter D1 as in the samples A and B (FIGS. 3A and 3B), with the result that insertion loss in a passband becomes flatter. The crosstalk between the antenna patterns ANT1 to ANT4 reduces as the distance L1 increases. The distance L1 may be 1.2 times or more of the diameter D1. Further, as in the sample F illustrated in FIG. 3F, when the interval between the two via conductors V3 positioned between the via conductor V1 and the electronic component 30 is made smaller, the crosstalk between the antenna patterns ANT1 to ANT4 reduces further. In the example illustrated in FIG. 3F, the interval between two via conductors V3 whose distance from the electronic component 30 are the same as the distance between the via conductor V1 and the electronic component 30 is 560 μm, while the interval between other two via conductors V3 whose distance from the electronic component 30 are smaller than the distance between the via conductor V1 and the electronic component 30 is reduced to 290 μm. FIG. 3G includes a table and a graph illustrating crosstalks in the samples A to E. The crosstalk to be evaluated herein includes that between reception signals R1 and R2, that between the reception signal R1 and a transmission signal Tx, and that between the reception signal R2 and the transmission signal Tx. As illustrated in FIG. 3G, the cross talk decreases with an increase in the value of "L/D" which is the ratio between the distance L1 and diameter D1. In particular, when the value of "L/D" is 1.2 or more, the crosstalk can be sufficiently reduced.

FIGS. 4A to 4K are process views for explaining a manufacturing method for the antenna module 100.

Figure 4A:
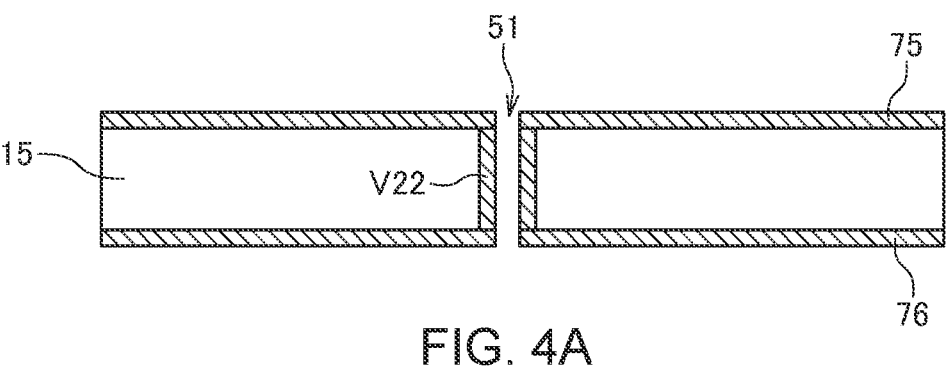
FIGS. 4A to 4K are process views for explaining a manufacturing method for the antenna module 100.
Figure 4B:
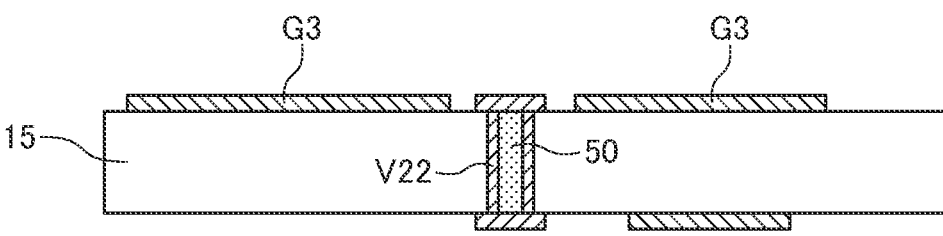
Figure 4C:
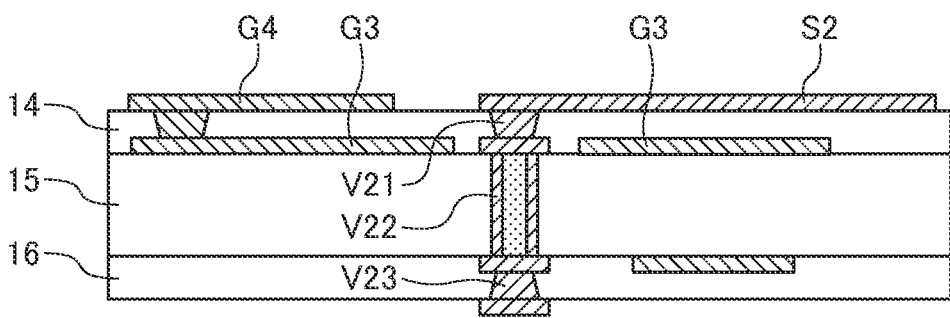

As illustrated in FIG. 4A, a through hole 51 is formed in the insulating layer 15, and then a conductive member such as Cu is formed in the entire surface including the inner surface of the through hole 51. As a result, the conductor layers 75 and 76 are formed respectively on the upper and lower surface sides of the insulating layer 15, and the via conductor V22 is formed on the inner surface of the through hole 51. Subsequently, as illustrated in FIG. 4B, the space surrounded by the via conductor V22 is filled with the insulating resin 50, followed by electrolytic plating and patterning of the conductor layers 75 and 76. This forms the ground pattern G3 in the conductor layer 75. Subsequently, as illustrated in FIG. 4C, the conductor layers 75 and 76 are respectively covered with the insulating layers 14 and 16. After that, the via conductors V21 and V23 are formed to respectively penetrate the insulating layers 14 and 16, and the conductor layers 74 and 77 positioned on the surfaces of the respective insulating layers 14 and 16 are patterned. This forms the signal pattern S2 and ground pattern G4 in the conductor layer 74.

Figure 4D:
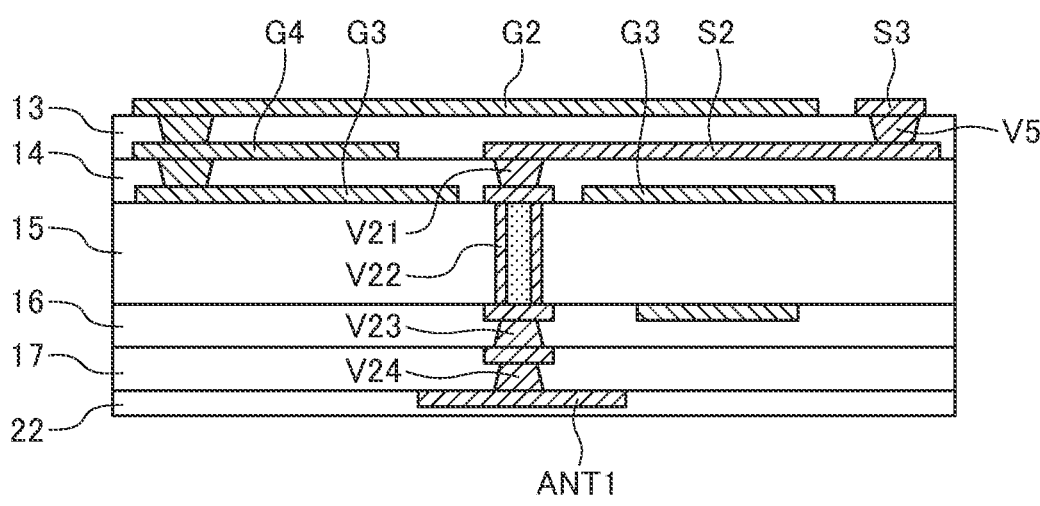

Then, as illustrated in FIG. 4D, the conductor layers 74 and 77 are respectively covered with the insulating layers 13 and 17. After that, the via conductors V5 and V24 are formed to respectively penetrate the insulating layers 13 and 17, and the conductor layers 73 and 78 positioned on the surfaces of the respective insulating layers 13 and 17 are patterned. This forms the signal pattern S3 and ground pattern G2 in the conductor layer 73. The antenna pattern ANT1 is formed in the conductor layer 78. The conductor layer 78 is covered with the solder resist 22.

Figure 4E:
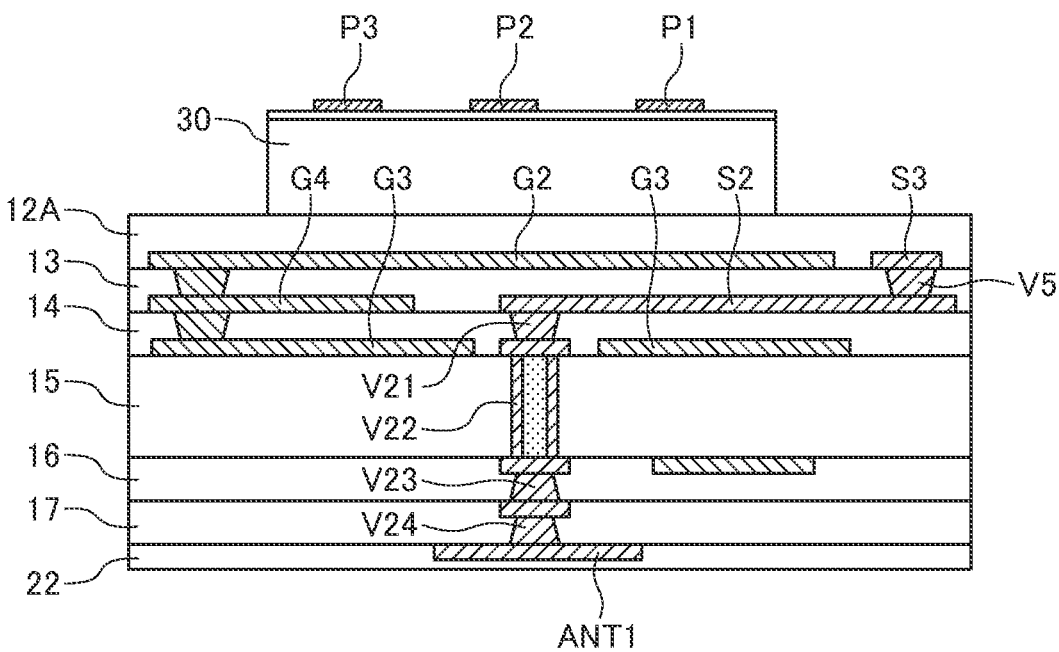

Then, as illustrated in FIG. 4E, the conductor layer 73 is covered with the insulating layer 12A, and the electronic component 30 is mounted on the surface of the insulating the

Figure 4F:
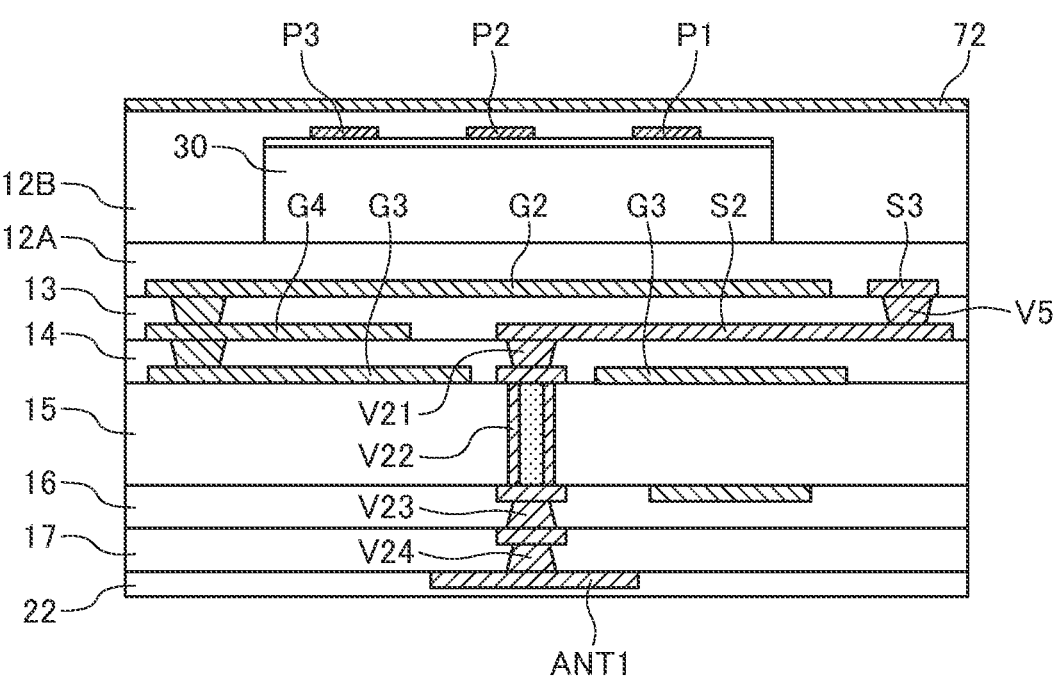
Figure 4G:
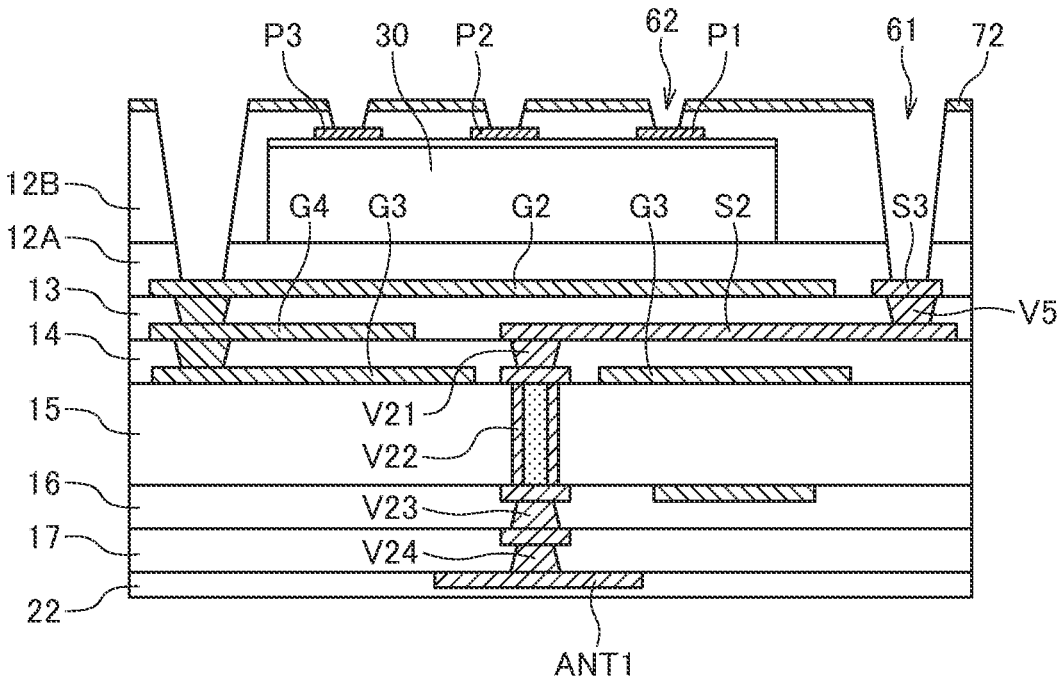

5 layer 12A. Subsequently, as illustrated in FIG. 4F, insulating layer 12B is formed on the surface of the insulating layer 12A so as to embed therein the electronic component 30. Subsequently, as illustrated in FIG. 4G, the conductor layer 72 formed on the surface of the insulating layer 12B is patterned, and via holes 61 and 62 are formed in the insulating layers 12A and 12B using the patterned conductor layer 72 as a mask. The via hole 61 penetrates the insulating layers 12A and 12B, and the conductor layer 73 is exposed to the bottom surface of the via hole 61. The via hole 62 is formed so as to overlap the electronic component 30, and a pad electrode is exposed to the bottom surface of the via hole 62.

Figure 4H:
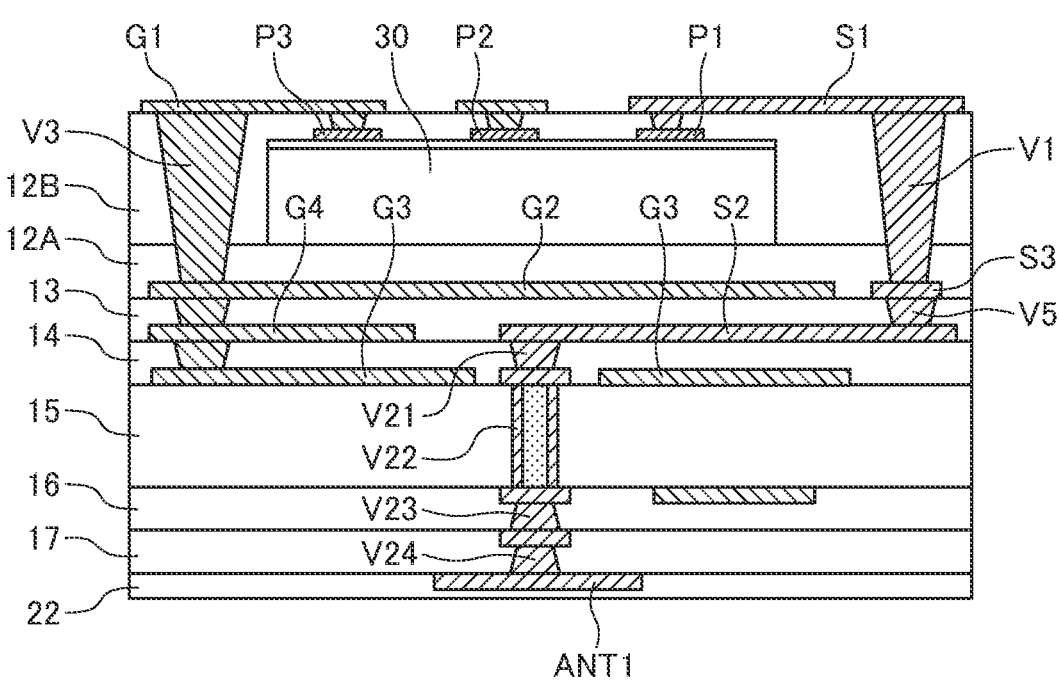
Figure 4I:
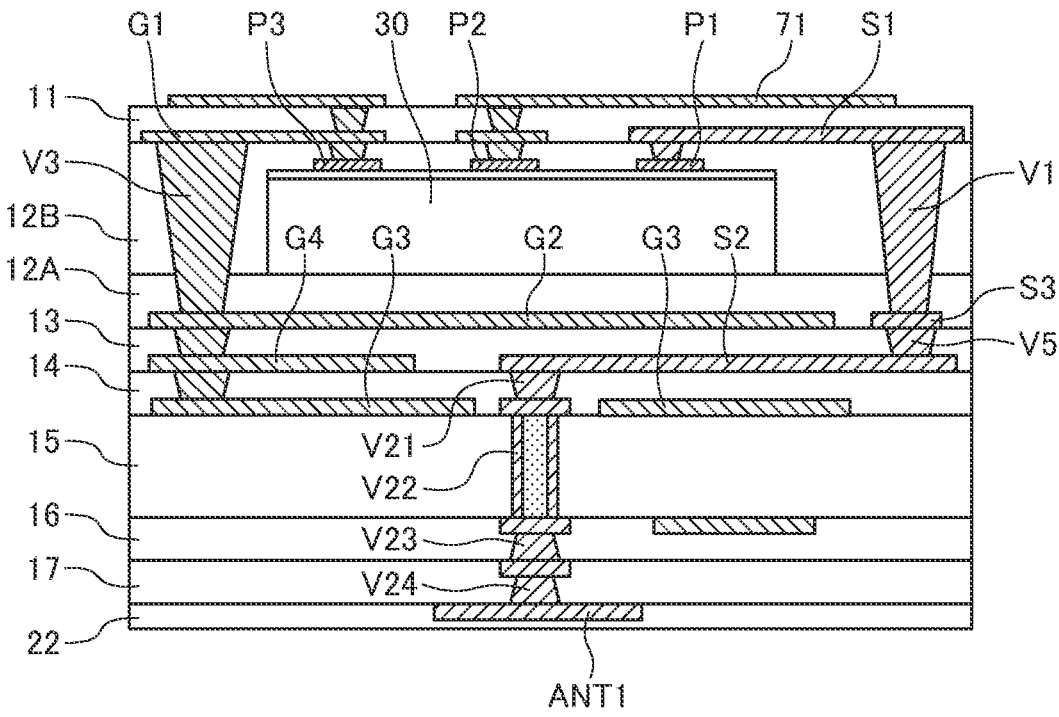
Figure 4J:
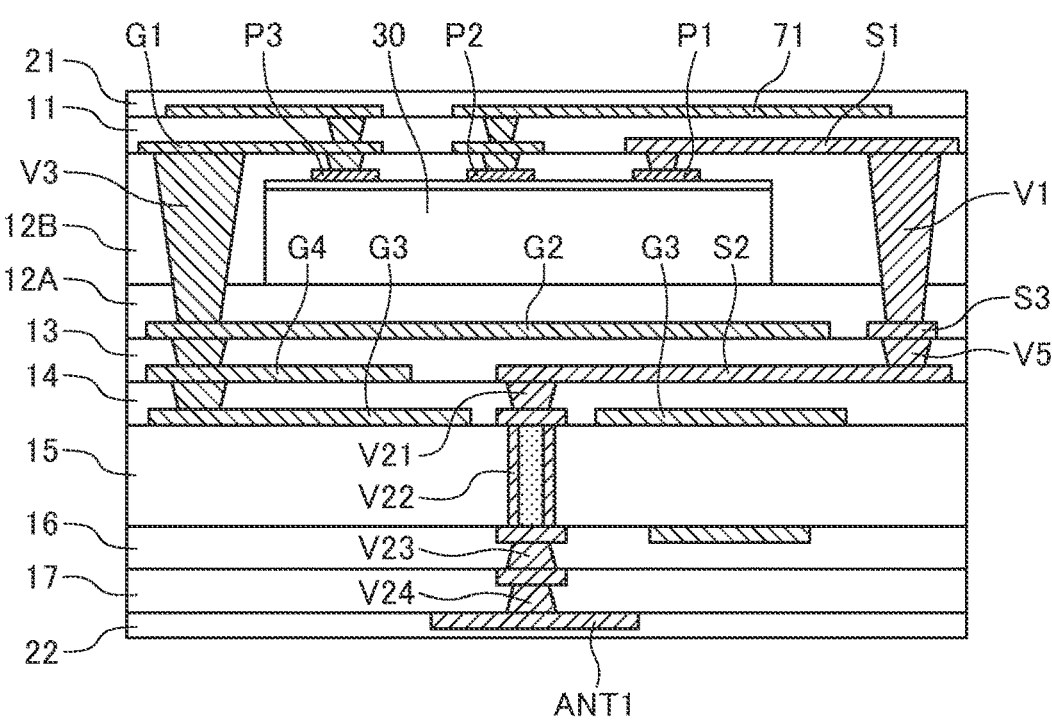
Figure 4K:
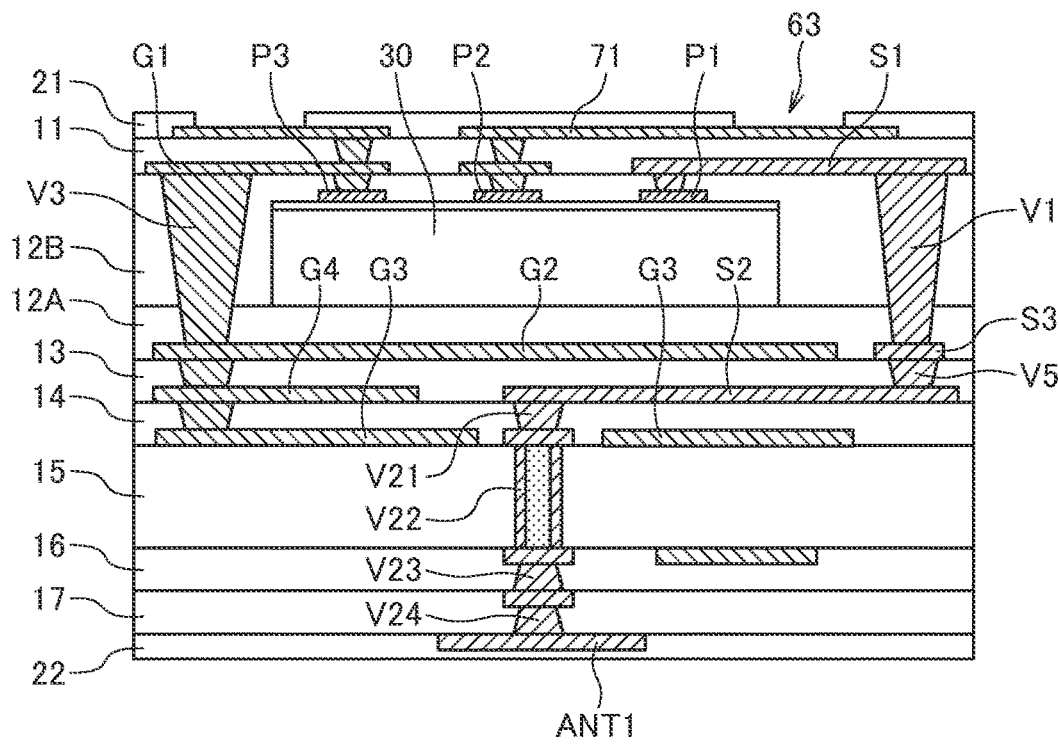

Then, as illustrated in FIG. 4H, the via holes 61 and 62 are filled with a conductive member, and the conductor layer 72 is patterned. As a result, the via conductors V1 and V3 are formed, and the signal pattern S1 and ground pattern G1 are formed in the conductor layer 72. Subsequently, as illustrated in FIG. 4I, the conductor layer 72 is covered with the insulating layer 11. After that, a via conductor that penetrates the insulating layer 11 is formed, and the conductor layer 71 positioned on the surface of the insulating layer 11 is patterned. Subsequently, the conductor layer 71 is covered with the solder resist 21 as illustrated in FIG. 4J, and openings 63 are formed in the solder resist 21. Subsequently, terminal electrodes are formed in the opening 63, whereby the structure illustrated in FIG. 2 can be obtained.

As described above, in the antenna module 100 according to the present embodiment, the distance L1 between the via conductor V1 connected to the antenna pattern ANT1 and the electronic component 30 is larger than the diameter D1 of the via conductor V1, so that crosstalk between the antenna patterns ANT1 to ANT4 due to coupling between the via conductor V1 and the electronic component 30 is reduced. In addition, the signal pattern S2 is shielded by the ground patterns G2 and G3 provided above and below the signal pattern S2, so that crosstalk between the antenna patterns ANT1 to ANT4 transmitted through the signal pattern S2 is also reduced.

While some embodiment of the present disclosure has been described, the present disclosure is not limited to the above embodiment, and various modifications may be made within the scope of the present disclosure, and all such modifications are included in the present disclosure.

The technology according to the present disclosure includes the following configuration examples but not limited thereto.

An antenna module according to one aspect of the present disclosure includes a multilayer substrate including a plurality of conductive layers and a plurality of insulating layers alternately stacked, and an electronic component embedded in the multilayer substrate and having a plurality of pad electrodes including a first signal pad. The plurality of conductive layers include an antenna layer having a plurality of antenna patterns, a first internal conductive layer having a first signal pattern, and a second internal conductive layer having a second signal pattern. The plurality of insulating layers include a first insulating layer positioned between the first and second internal conductive layers, and a second insulating layer positioned between the second internal conductive layer and the antenna layer. The electronic component is embedded in the first insulating layer such that the first signal pad is connected to the first signal pattern. The first and second signal patterns are connected to each other by a first via conductor penetrating through the first insulating layer. The second signal pattern and one of the antenna patterns are connected to each other by a second via conductor penetrating through the second insulating layer. The distance between the electronic component and the first via conductor is greater than a diameter of the first via conductor. According to this aspect of the present disclosure, it is possible to obtain good antenna characteristics since the coupling between the first via conductor and the electronic component is suppressed.

In the antenna module, the plurality of conductive layers may further include a terminal layer having a plurality of terminal electrodes, and the plurality of insulating layers may be disposed between the terminal layer and the antenna layer. According to this, a plurality of terminal electrodes can be provided on the opposite surface of the antenna layer.

In the antenna module, the plurality of terminal electrodes may include a signal terminal, and the plurality of pad electrodes may further include a second signal pad connected to the signal terminal. According to this, it becomes possible to supply a signal to the electronic component via the signal terminal.

In the antenna module, the plurality of terminal electrodes may include a ground terminal, and the plurality of pad electrodes may further include a ground pad connected to the ground terminal. According to this, it becomes possible to supply a ground potential to the electronic component via the ground terminal.

In the antenna module, the first internal conductive layer may further have a first ground pattern connected to the ground pad, the plurality of conductive layers may further include a third internal conductive layer disposed between the electronic component and the second internal conductive layer and having a second ground pattern, and the first and second ground patterns may be connected to each other by a third via conductor penetrating through the first insulating layer. According to this, it becomes possible to shield the electronic component from the back side.

In the antenna module, the distance between the electronic component and the first via conductor may be greater than a distance between the electronic component and the third via conductor. According to this, it becomes possible to more effectively suppress the coupling between the first via conductor and the electronic component.

In the antenna module, a diameter of the third via conductor may be greater than the diameter of the first via conductor. According to this, it becomes possible to further stabilize the ground potential.

In the antenna module, the plurality of conductive layers may further include a fourth internal conductive layer having a third ground pattern, and the second internal conductive layer may be positioned between the third and fourth internal conductive layers such that the second signal pattern is sandwiched between the second and third ground patterns. According to this, it becomes possible to shield the second signal pattern with the second ground pattern and the third ground pattern.

In the antenna module, the second insulating layer may include a first core insulating layer, a second core insulating layer positioned between the first core insulating layer and the second internal conductive layer, and a third core insulating layer positioned between the first core insulating layer and the antenna layer. According to this, the second insulating layer can be formed by forming the second and third core insulating layers on the front and back sides of the first core insulating layer.

In the antenna module, the second via conductor may include first, second, and third sections penetrating through the first, second, and third core insulating layers, respectively. According to this, it becomes possible to connect the second signal pattern and the antenna pattern via the first, second, and third sections.

In the antenna module, the first, second, and third sections may overlap one another in a stacking direction. According to this, it becomes possible to shorten the connection distance between the second signal pattern and the antenna pattern.

An antenna module according to another aspect of the present disclosure includes: a multilayer substrate in which a plurality of conductor layers including a first insulating layer and a plurality of insulating layers are alternately stacked; and an electronic component embedded in the first insulating layer and having a plurality of pad electrodes including a first signal pad and a ground pad. The plurality of conductor layers include a first signal pattern, a second signal pattern, a first ground pattern, and a second ground pattern. The first signal pattern and first ground pattern are formed on one side in the stacking direction as viewed from the electronic component. The second signal pattern and second ground pattern are formed on the other side in the stacking direction as viewed from the electronic component. The first signal pad of the electronic component is connected to the first signal pattern. The ground pad of the electronic component is connected to the first ground pattern. The first and second signal patterns are connected to each other through a first via conductor penetrating the first insulating layer. The second signal pattern is electrically connected to an antenna pattern formed in any one of the plurality of conductor layers. The first and second ground patterns are connected to each other through a second via conductor penetrating the first insulating layer. The first ground pattern is electrically connected to a ground terminal. The distance between the electronic component and the first via conductor is larger than the distance between the electronic component and the second via conductor. This reduces coupling between the first via conductor and the electronic component, thus making it possible to achieve satisfactory antenna characteristics.

In the above antenna module, both the first signal pattern and first ground pattern may be formed in a first conductor layer included in the plurality of conductor layers. This can reduce the number of conductor layers.

In the above antenna module, the second signal pattern and second ground pattern may be formed respectively in second and third conductor layers included in the plurality of conductor layers. This increases design freedom. In this case, the second conductor layer may be positioned between the electronic component and the third conductor layer. This can reduce coupling between the second signal pattern and the electronic component.

What is claimed is:

1. An apparatus comprising:
a multilayer substrate including a plurality of conductive layers and a plurality of insulating layers alternately stacked; and
an electronic component embedded in the multilayer substrate and having a plurality of pad electrodes including a first signal pad,
wherein the plurality of conductive layers include:
an antenna layer having a plurality of antenna patterns;
a first internal conductive layer having a first signal pattern; and
a second internal conductive layer having a second signal pattern, wherein the plurality of insulating layers include:
a first insulating layer positioned between the first and second internal conductive layers; and
a second insulating layer positioned between the second internal conductive layer and the antenna layer,
wherein the electronic component is embedded in the first insulating layer such that the first signal pad is connected to the first signal pattern,
wherein the first signal pattern and the second signal pattern are connected to each other by a first via conductor penetrating through the first insulating layer,
wherein the second signal pattern and one of the plurality of antenna patterns are connected to each other by a second via conductor penetrating through the second insulating layer, and
wherein a distance between the electronic component and the first via conductor is greater than a diameter of the first via conductor.

2. The apparatus as claimed in claim 1,
wherein the plurality of conductive layers further includes a terminal layer having a plurality of terminal electrodes, and
wherein the plurality of insulating layers are disposed between the terminal layer and the antenna layer.

3. The apparatus as claimed in claim 2,
wherein the plurality of terminal electrodes include a signal terminal, and
wherein the plurality of pad electrodes further include a second signal pad connected to the signal terminal.

4. The apparatus as claimed in claim 2,
wherein the plurality of terminal electrodes include a ground terminal, and
wherein the plurality of pad electrodes further include a ground pad connected to the ground terminal.

5. The apparatus as claimed in claim 4,
wherein the first internal conductive layer further has a first ground pattern connected to the ground pad,
wherein the plurality of conductive layers further include a third internal conductive layer disposed between the electronic component and the second internal conductive layer and having a second ground pattern, and
wherein the first and second ground patterns are connected to each other by a third via conductor penetrating through the first insulating layer.

6. The apparatus as claimed in claim 5, wherein the distance between the electronic component and the first via conductor is greater than a distance between the electronic component and the third via conductor.

7. The apparatus as claimed in claim 5, wherein a diameter of the third via conductor is greater than the diameter of the first via conductor.

8. The apparatus as claimed in claim 5,
wherein the plurality of conductive layers further include a fourth internal conductive layer having a third ground pattern, and
wherein the second internal conductive layer is disposed between the third and fourth internal conductive layers such that the second signal pattern is sandwiched between the second and third ground patterns.

9. The apparatus as claimed in claim 8, wherein the second insulating layer includes:
a first core insulating layer;
a second core insulating layer disposed between the first core insulating layer and the second internal conductive layer; and
a third core insulating layer disposed between the first core insulating layer and the antenna layer.

10. The apparatus as claimed in claim 9, wherein the second via conductor includes first, second, and third sections penetrating through the first, second, and third core insulating layers, respectively.

11. The apparatus as claimed in claim 10, wherein the first, second, and third sections overlap one another when viewed from a stacking direction.

12. An apparatus comprising:

a multilayer substrate in which a plurality of conductor layers including a first insulating layer and a plurality of insulating layers are alternately stacked; and an electronic component embedded in the first insulating layer and having a plurality of pad electrodes including a first signal pad and a ground pad, wherein the plurality of conductor layers have a first signal pattern, a second signal pattern, a first ground pattern, and a second ground pattern, wherein the first signal pattern and the first ground pattern are disposed on one side in the stacking direction with respect to the first insulating layer in which the electronic component is embedded, wherein the second signal pattern and the second ground pattern are disposed on another side in the stacking direction with respect to the first insulating layer, wherein the first signal pad of the electronic component is connected to the first signal pattern, and the ground pad of the electronic component is connected to the first ground pattern, wherein the first signal pattern and the second signal pattern are connected to each other through a first via conductor penetrating the first insulating layer, wherein the second signal pattern is electrically connected to an antenna pattern formed in any one of the plurality of conductor layers, wherein the first ground pattern and the second ground pattern are connected to each other through a second via conductor penetrating the first insulating layer, wherein the first ground pattern is electrically connected to a ground terminal, and wherein a distance between the electronic component and the first via conductor is larger than a distance between the electronic component and the second via conductor.

13. The apparatus as claimed in claim 12, wherein both the first signal pattern and the first ground pattern are disposed in a first conductor layer, the first conductor layer being included in the plurality of conductor layers.

14. The apparatus as claimed in claim 12, wherein the second signal pattern and the second ground pattern are disposed respectively in a second conductor layer and a third conductor layer, both of the second conductor layer and the third conductor layer being included in the plurality of conductor layers.

15. The apparatus as claimed in claim 14, wherein the second conductor layer is positioned between the electronic component and the third conductor layer.

* * * * *